United States Patent [19]
O'Loughlin et al.

[11] Patent Number: 5,656,873
[45] Date of Patent: Aug. 12, 1997

[54] TRANSMISSION LINE CHARGING

[75] Inventors: James P. O'Loughlin, Placitas; Diana L. Loree, Albuquerque, both of N. Mex.

[73] Assignee: The United States of America as represented by the Secretary of the Air Force, Washington, D.C.

[21] Appl. No.: 597,740

[22] Filed: Feb. 7, 1996

[51] Int. Cl.$^6$ ......................................................... H03K 3/00
[52] U.S. Cl. .............................. 307/106; 315/39; 315/71; 333/20; 333/24 R; 333/34
[58] Field of Search .............................. 307/106, 107; 333/20, 24 R, 32, 34; 327/100, 301, 309; 315/39, 71

[56] References Cited

U.S. PATENT DOCUMENTS

| | | | |
|---|---|---|---|
| 3,761,846 | 9/1973 | Tsuboi | 333/34 |
| 4,477,746 | 10/1984 | Piltch | 315/39 |
| 4,730,172 | 3/1988 | Bengeult | 333/34 |
| 4,871,925 | 10/1989 | Yamauchi et al. | 307/106 |
| 4,912,369 | 3/1990 | Moran et al. | 315/58 |
| 4,918,325 | 4/1990 | Busby et al. | 307/106 |
| 5,412,254 | 5/1995 | Robinson | 307/106 |
| 5,444,308 | 8/1995 | O'Loughlin | 307/106 |

OTHER PUBLICATIONS

Theodore Moreno, microwave transmission desigh data, Dover Publication, Sperry Gyroscope Co., pp. 52–53 1948.

Primary Examiner—Jonathan Wysocki
Assistant Examiner—Peter Ganjoo
Attorney, Agent, or Firm—William G. Auton

[57] ABSTRACT

A device for charging PFLs (Pulse Forming Lines) on a time scale of a few nanoseconds. The device includes a source transmission line (STL) connected through a switch to a pulse forming transmission line. The source line is initially charged while the PFL is uncharged, and the switch is open. The impedance of the STL is larger than the impedance of the PFL. The impedance of the STL is also tapered in order to effect an energy transfer efficiency approaching 100% from the STL to the PFL. In operation when the switch is closed, energy flows from the source line to the PFL. As the energy and voltage build on the PFL, an output switch closes and delivers the energy of the PFL to the output transmission line section. The impedance of the output transmission line section is matched to the PFL impedance so that all of the energy in the PFL flows into the output section in the form of a pulse.

12 Claims, 3 Drawing Sheets

CONTINOUSLY TAPERED LINE

STEP-TAPERED LINE

TRANSMISSION LINE CHARGING

STATEMENT OF GOVERNMENT INTEREST

The invention described herein may be manufactured and used by or for the Government for governmental purposes without the payment of any royalty thereon.

BACKGROUND OF THE INVENTION

The invention relates to pulse generation, and more specifically to the high-speed charging of PFLs (Pulse Forming Lines) on a nanosecond (ns) or picosecond (ps) time scale. Historically pulse generation has taken place by the discharge of a charged PFL into a load. To generate very short pulses, ranging from nanoseconds to picoseconds, a fast switch is required. High pressure multichannel gas switches are capable of not only fast switching, they can handle higher voltages than almost any other type of switch including solid state. Switching speeds on the order of a few picoseconds are possible at several hundred kilovolts. In multichannel operation switch closure is of multiple channels producing a lower/overall switch impedance due to a large number of impedances in parallel per channel.

For multichannel operation it is necessary to "over volt" the switch by applying a rapidly changing voltage. Conventionally this has been done by using either a charging inductor or a charging resistor. However, when the charging time is on the order of nanoseconds, this is impractical because the impedance of components must be so low that there is insufficient isolation from the charging power source.

The rapid charging of a PFL, or the rapid application of a voltage to a switch, is attemped generally in the following U.S. Patents, the disclosures of which are incorporated herein by reference: U.S. Pat. No. 4,918,325 issued to Busby et al.; U.S. Pat. No. 4,912,369 issued to Moran et al.; U.S. Pat. No. 4,871,925 issued to Yamauchi et al.; and U.S. Pat. No. 4,477,746 issued to Piltch.

In Busby et al. a fast rise-time pulse is realized by a pulse generator that is electrically connected to a load by a coaxial transmission line with a polyvinyl chloride (PVC) dielectric flashover switch. The outer conductor of the transmission line is directly connected between the pulse generator and the load, while the inner conductor has two sections interconnected by the PVC switch. This system provides a current and voltage subnanosecond rise/time.

Moran et al. disclose a triggerable, spark gap switch for high voltage, high current, pulse power systems. Triggering is by an arc between one electrode and a trigger pin, with high repetition rates obtained by operating at voltages below the self-breakdown voltage of the switch.

Yamauchi et al. have a high-voltage pulse generator with a toroidal core switch of soft magnetic alloy ribbon. The alloy contains elements such as iron, copper, niobium, tantalum, molybdinum and titanium, and is at least fifty percent crystalline.

Piltch describes a high repetition rate switch for delivering short duration, high power electrical pulses by an electric field between electrodes near breakdown. A microwave generator connected to a waveguide produces pulses having sufficient energy to distort the electric field and cause breakdown between rail electrodes, which provide a large conduction area that reduces induction effects and minimizes electrode erosion.

Although the foregoing patents relate to pulse generation they do not facilitate energy flow. Accordingly it is an object of the invention to enhance pulse production using impedance matching techniques.

Another object of the invention to provide for rapid charging of PFLs (Pulse Forming Lines). A related object is to generate subnanosecond pulses using high-pressure gas switches, having low inductance with gas pressures up to 350 atmospheres or more, and high voltage capability and subnanosecond switching speed.

A further object of the invention is to increase the transfer efficiency of energy from a source to a PFL line. A related object is to realize energy transfer efficiencies approaching 100%.

SUMMARY OF THE INVENTION

In accomplishing the foregoing on related objects the invention makes use of internal voltage reflections of a wave in a non-uniform source or charging line. Because the line is non-uniform it has a variable impedance, i.e. that variably modifies current flow along the line. As a result, an energy transfer efficiency approaching 100% on a time scale of a few nanoseconds or picoseconds can be achieved.

The non-uniform Source Transmission Line (STL) of the invention is connected through an intermediate switch to a Pulse Forming Line (PFL). The STL is initially charged, while the PFL is uncharged and the switch open, with the impedance of the load end of the STL larger than that of the PFL.

When the switch operates, as by selfbreaking, energy flows from the STL to the PFL. As energy and voltage build on the PFL, an output switch closes and delivers the energy of the PFL to an output transmission line. The impedance characteristics of the output and source transmission line is matched to that of the PFL, so that all of the PFL energy flows into the output line in the form of a pulse.

In accordance with one aspect of the invention the non-uniform transmission line has a taper which can be continuous or a series of steps, with the impedance of each line step selected to approximate the taper of a continous line.

The tapered line is proportioned to raise the energy transfer from the tapered STL line to the PFL to a value approaching 100%, with the internal voltage reflections causing interactions which result in more efficient coupling of energy to the PFL.

In accordance with another aspect of the invention the maximum transfer efficiency from the STL to the output PFL is established by a particular relationship for the taper characteristic, the electrical length of the lines and their impedances, with the tapered line impedance characteristic defined in terms of the ratio of impedances at the ends of the line, and the impedance taper along the line specified such that the fractional rate of change of impedance along the line is constant, i.e. $dZ(l)/Z(l)=k*dl$.

where $Z(l)$=impedance of the line at position l;
$dZ(l)$=differential impedance at position l;
d=differential length;
*=the operation of multiplication; and
k=a constant value.

DESCRIPTION OF THE DRAWINGS

Other aspects, features and advantages of the invention will become apparent from the following detailed description, taken in conjunction with the accompanying drawing wherein like elements are given like reference numerals throughout.

DETAILED DESCRIPTION OF PREFERRED EMBODIMENTS

The present invention provides for the charging of PFLs an a time scale of a few nanoseconds or picoseconds, with efficiencies approaching 100%

Figure 1:
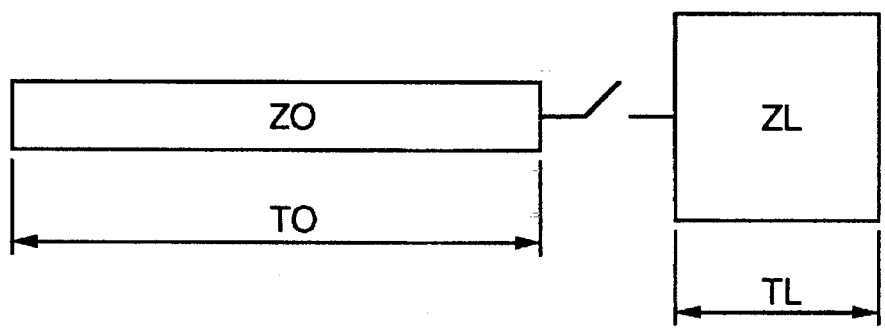
FIG. 1 is an illustration of my prior pulse forming system.

My prior invention, illustrated in FIG. 1 provides for operation in the nanosecond or picosecond range by an improved method for rapidly charging the PFL, or equivalently applying voltage to an output switch.

In FIG. 1, however, the maximum theoretical energy transfer efficiency is 81.5% and occurs when the ratio of STL impedance to PFL impedance, divided by the ratio of STL electrical length to PFL electrical length is 1.6.

In other words if (ZO/ZL)/(TO/TL)=1.6, energy transfer is optimum at 81.5 percent, where Z0=STL characteristic impedance; ZL=PFL load impedance; TO=STL Delay time duration (during one-way transit time to PFL); and TL=PFL time duration.

Although the realizable maximum efficiency of 81.5% is reasonably high, it still represents a considerable loss of energy. In addition to energy loss, untransferred energy can also lead to such circuit problems as pulse waveform distortion, heating of various components and high voltage break-down.

Figure 2A:
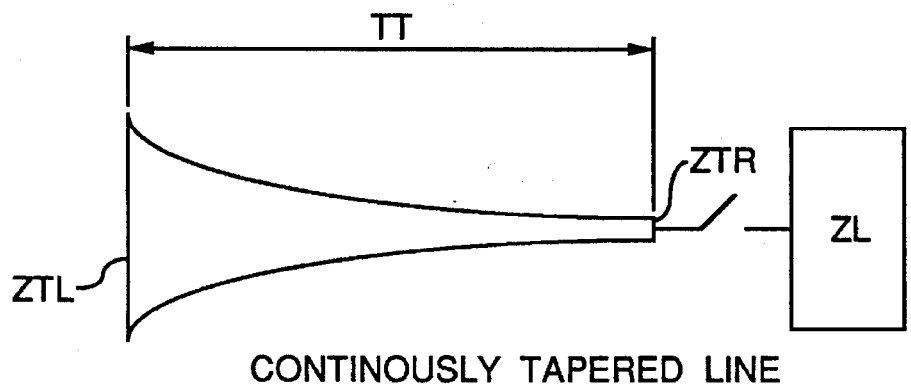
FIG. 2a is a continuously tapered charging line illustration of my present invention.
Figure 2B:
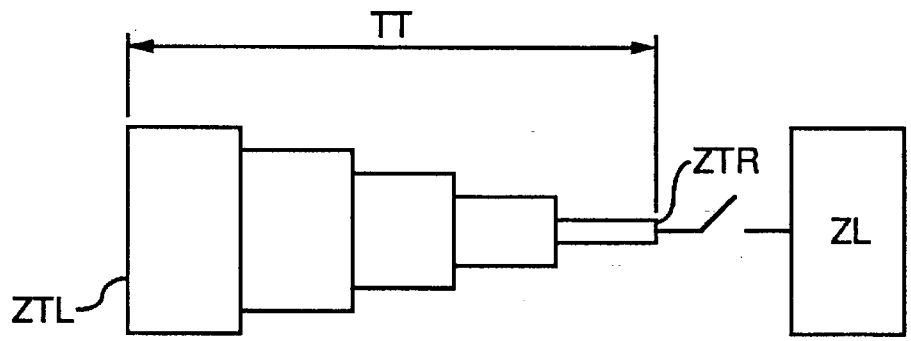
FIG. 2b is a step-tapered charging line illustration of my present invention.

In order to achieve energy transfer efficiency approaching 100%, the invention, as illustrated in FIGS. 2a and 2b replaces the source transmission line with a tapered impedance line such that the impedance adjacent to the PFL is high and tapers to a low value as a function of the distance from the PFL end.

The implementation of the tapered line of the invention may be either by a single line with a continuous taper or a series of line sections which may be each uniform, and selected to approximate the taper of a continuous line. Both continuous and series section tapered lines can improve the energy transfer from the source line to the PFL to a value approaching 100%. This improvement is a result of internal voltage reflections which occur because the source transmission line is nonuniform. The interactions of these reflections result in a more efficient coupling of energy to the PFL line. In order to achieve the maximum transfer efficiency it is necessary to establish particular relationships for taper characteristic and electrical length and impedance. The impedance of a tapered line is defined in terms of the ratio of impedances at the ends of the line, constituting an impedance taper factor AZ, and the way in which the taper behaves along the line.

The impedance taper along the line can be specified so that the fractional rate of change of impedance along the line is constant, i.e. $dZ(l)/Z(l)=k*dl$.

where $Z(l)$=impedance at line position l;
$dZ(l)$=differential impedance at line position l;
  d=differential length at line position l;
  *=operation of multiplication; and already defined.
k=line (taper) constant.

Therefore the impedance $Z(l)$ as a function of line length l is given by equation (1), below:

$$Z(l)=Z(O)\ exp(k*l) \qquad (1)$$

where: $Z(l)$=the impedance at a distance measured from the left end in FIGS. 2a and 2b of the charging line;

$Z(O)$=the impedance at the left end of the charging line, i.e. where l=0.0;

In FIGS. 2a and 2b, the output impedance of the STL, i.e. charging line is ZTR (impedance-terminal-right).

Thus for a line of length L, the impedance ratio of the impedances at the two ends of the line from equation (1) is, $Z(O)/Z(L)=exp(-k*L)=AZ$ (impedance taper ratio). This Equation (1) defines the impedance taper for a continuous line. For a series of equal length lines of different impedances used to approximate the continuous line, the impedances of the sections are defined by equation (2) below. If there are N sections of line to approximate the tapered line with an impedance ratio AZ, then the impedance of each section is determined as:

$$Z(n)=Z(O)\ AZ^{(n-1)/(N-1)} \qquad (2)$$

where: $Z(n)$=the impedance of the nth section

The continuously tapered line can be analyzed using an extension of the method explained in my paper "Transmission Line Analysis on Personal Computers" published in the Conference Record of the Seventeenth Power Modulator Symposium, 1986.

The series section lines can be analyzed using matrix circuit techniques.

The results for both continuously and series-section tapers are similar and in agreement.

The parameters of interest are the time compression ratio, TC=TT/TL, i.e. the ratio of the total source line delay time TT to the PFL total delay time TL; the ratio ZN of the impedance ZTR at the output end of the source line to the impedance ZL of the PFL, i.e. ZN=ZTR/ZL; and the impedance ratio AZ=ZTR/ZTL for the taper of the source line.

The efficiency of the energy transfer from the source line STL to the PFL is determined under the following conditions: The source line is charged to a voltage which determines the initial energy, and PFL is initially at zero voltage and energy. The switch between the lines STL and PFL is closed at zero time. The energy transfer efficiency is then defined as the energy accumulated in the PFL at a time equal to twice the one way delay time of the source line after the switch closes. With the time compression ratio at a fixed value, the energy transfer efficiency is evaluated to determine the maximum transfer as the parameters ZN (impedance ratio) and AZ (line taper) are swept over a range sufficiently wide to find the optimum.

With the value of AZ in the range of approximately 3 to 4, the optimum energy transfer occurs when ZN has a value equal to twice the time compression ratio. Under these conditions the energy transfer approaches 100 percent.

Figure 3:
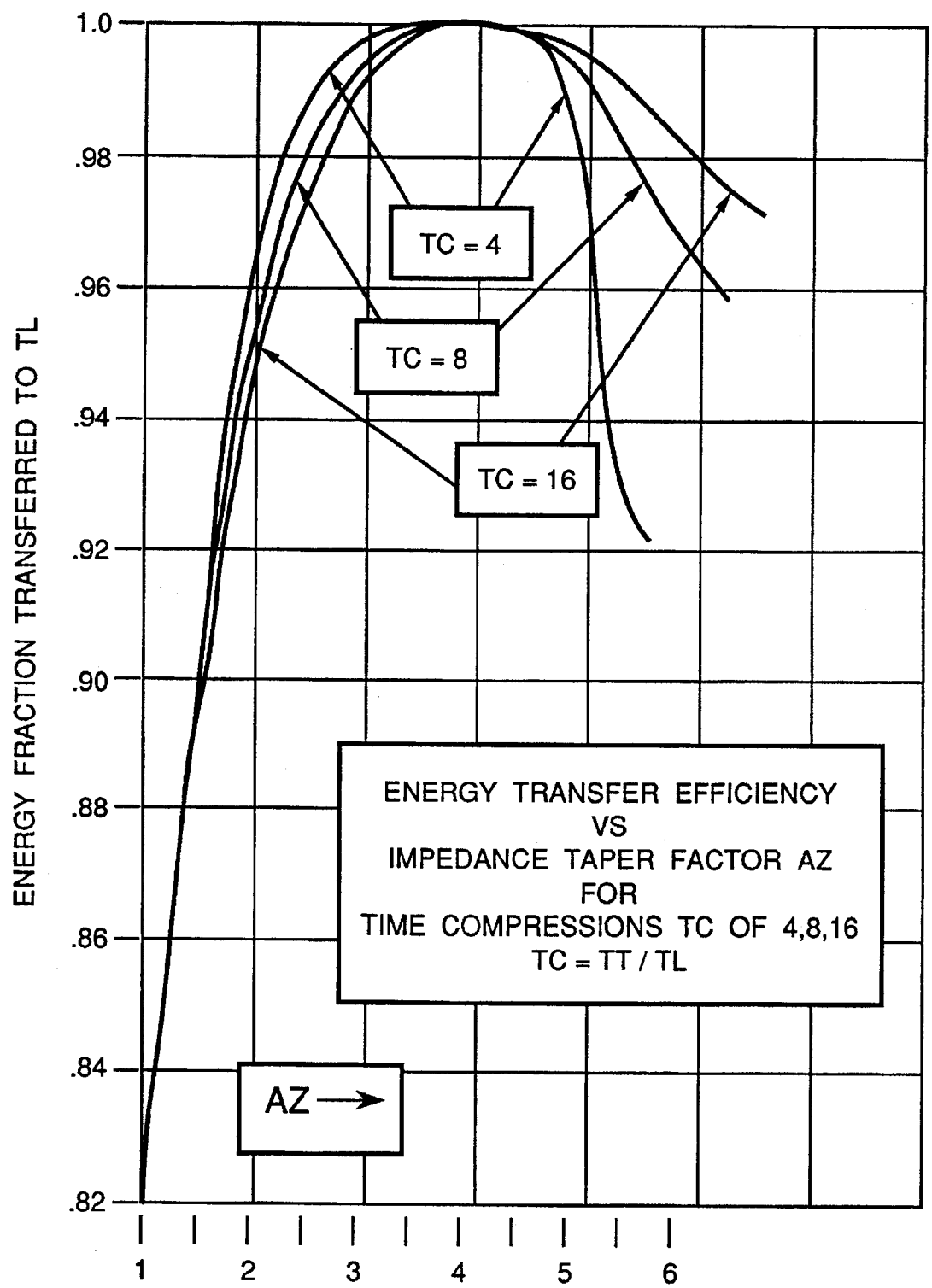
FIG. 3 is a chart of energy transfer efficiency plotted against impedance taper factor (AZ) for time compressions (TC) of 4, 8, 16.

Energy transfer is shown in FIG. 3 with the energy transfer efficiency plotted as function of taper factor AZ for values of time compression TC equal to 4, 8 and 16. The energy transfer approaches 100 percent for the time compression between about 3.7 and 4.2.

Figure 4:
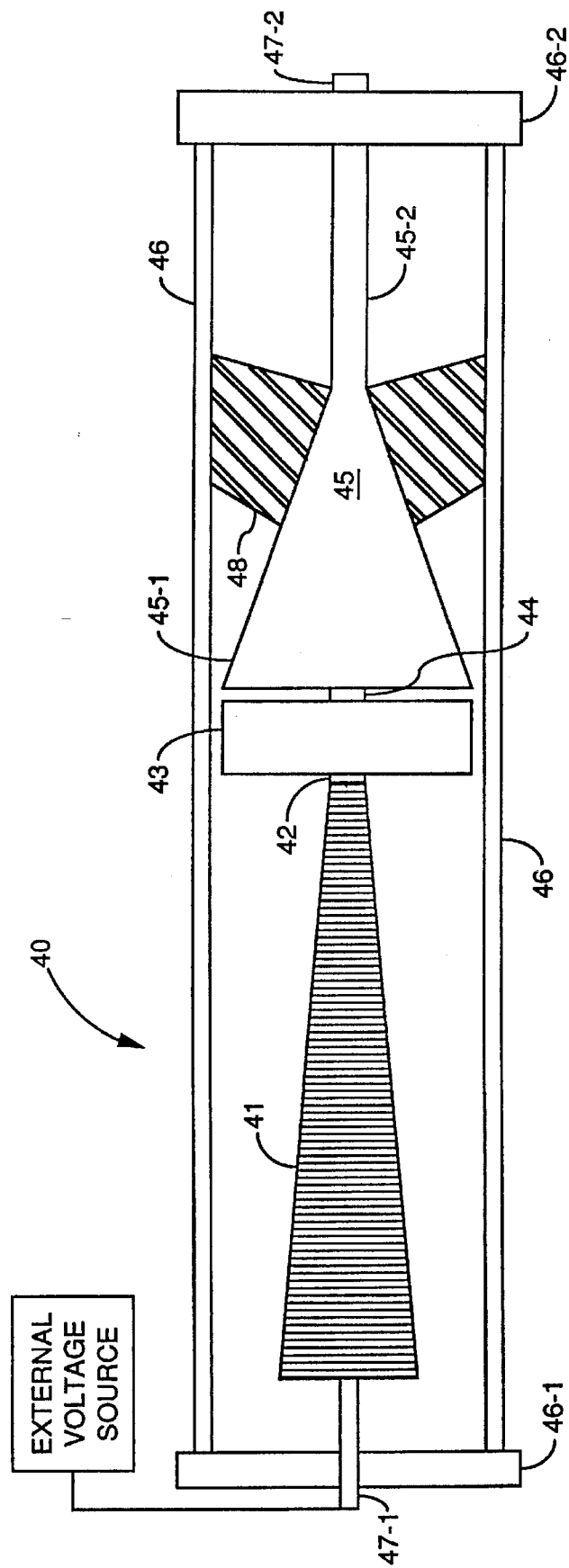
FIG. 4 is a diagram of a specific design example illustrating the invention.

In the pulse generation system 40 of the invention shown FIG. 4, a non-uniform source transmission line STL 41 with an impedance that varies as a function of length (l) ranging from ZO to $Z(l)=Z0\ exp\ (k*f)$, and transit time TT, is connected through an intermediate switch 42 to a pulse forming transmission line PFL 43 with impedance ZL and transit time TL. The source line 41 is initially charged with the switch 42 open, so that the PFL 43 is uncharged.

The impedance of the STL line 41 is larger than ZL, and the transit time TT of the line 41 is larger than the delay time TL of the PFL 43. When the intermediate switch 42 closes, energy flows from the source line 41 to the PFL 43. As the energy and voltage build up on the PFL 43 an output switch 44 closes and delivers the energy of the PFL to an output transmission line 45.

The impedance of the output transmission line 45 is matched to the PFL 43 impedance, so that all of the energy in the PFL 43 flows into the output line 45 in the form of a pulse with time duration equal to 2*TL. The output line 45 is also configured as a tapered transmission line 45-1 with an input impedance equal to the PFL impedance ZL and an output impedance equal to the load impedance connected at terminal 47-2. The tapered impedance of the line 45-1 matches the PFL impedance ZL to the load impedance for maximum efficiency transfer of energy from the PFL to the load (not shown).

The implementation of the invention in general requires that the PFL impedance ZL be a particular value not necessarily matched to the required load impedance. Thus tapered output section 45-1 provides the desired impedance matching or transformation between the PFL and the load. The entire pulse generator 40 is enclosed in a sealed container 46 which serves as an enclosure for high pressure gas and an outer coaxial conductor.

The respective ends 46-1 and 46-2 of the container 46 are fitted with a feed-thru input coaxial terminal 47-1 and the output terminal 47-2. A seal 48 is provided for isolating high-pressure gas, which is required for the operation of the switches 42 and 44, and to serve as electrical insulation between the inner and outer conductors of the coaxial lines 41 and 45.

In order to charge the source line 41 an external source (not shown) is connected to the line 41 through the terminal 47-1. The external source may be any of several types commonly used for transmission line charging. A suitable external source is a high voltage DC (direct current) power supply with a charging resistor or a charging inductor connected between the power supply and the terminal 47-1. Another suitable external source is a double resonant transformer with its secondary winding connected to the terminal 47-1, as described in my co-pending application, Ser. No. 08/054,934 filed 23 Apr. 1993, the disclosure of which is incorporated herein by reference.

The switches 42 and 44 are implemented by spark gap switch technology of the kind disclosed in my U.S. Pat. No. 4,963,799, which is incorporated herein by reference.

ILLUSTRATIVE DESIGN EXAMPLE

Still other aspects of the invention will be apparent from the following, non-limiting Design Example for the system of FIG. 4 in which a pulse forming transmission line is a pulse forming transmission line is to meet the requirements of Table I.

TABLE I

| Parameter | Valve |
| --- | --- |
| Output Pulse Width | 350 pS (picoseconds) |
| Output Impedance | 30 Ohms |
| Output Power Level | 250 GW (Gigawatts) |

For the output switch 43 to function in a fast over-voltage mode, the output section 45 is charged in a time no greater than a few nanoseconds (ns). The output PFL 43 is specified as TP=350 ps, and a suitable time compression (TC) of 8 is selected. This determines the time length of the tapered source line 41 to be TT=2.8 ns, and the source line 41 is conveniently charged by a tuned transformer through the high voltage charging connection 47-1. Tuned transformer technology for this purpose is of the kind described in the paper by G. J. Rhowein, "Design of Pulse Transformers for PFL Charging", Proceedings of the 2nd IEEE Pulsed Power Conference, Lubbock Tex., June 1979.

The output impedance requirement at the terminal 47-2 is 30 Ohms. Since the selected time compression ratio TC is 8, the impedance ratio ZTR/2L of the source line high end impedance ZTR is 16. This implies a source line high-end impedance of 480 Ohms, which is impractical for a coaxial line. Therefore we select a practical value, such as 150 Ohms. As a result the PFL impedance ZL becomes (150/16)=9.375 Ohms, and impedance transformer 45-1 transforms the 9.375 Ohms to the required 30 Ohms, which is the value at the output connection 45-2 beyond the pressure seal 48. The impedance transformer 45-1 is only required if the impedance(s) of the source 41 and/or PFL transmission line 43 have impractical values.

The range of practical impedance values for a coaxial line is from about 5 to 150 Ohms. The low end impedance of the tapered impedance source line 41 is calculated as 50 Ohms by dividing the high end impedance of 150 Ohms by the impedance taper ratio (AZ=3).

The high pressure vessel 46 is chosen with a diameter of 20 cm operating at 200 Atmospheres of Nitrogen. The lengths of the tapered line 41 and output PFL 43 are determined by multiplying one half of their time-lengths by speed of light, and are thus determined to be 42 cm and 5.25 cm respectively. The diameters of the lines 41 and 43 are determined from the diameter of the pressure vessel and the impedances of the lines using equation (3), below, for characteristic impedance as a function of dimensions.

$$Z_o = 60 \ln(d2/d1) \tag{3}$$

where: $Z_o$=The characteristic impedance of a coaxial line, Ohms
    d2=The inside diameter of outer conductor, cm
    d1=The outside diameter of the inner conductor, cm The peak power which the design can achieve is determined by the maximum operating voltage and the impedance. The voltage limits or breakdown values are different for different sections of the design. The break-down electric field is a function of gas density and the time duration during which electric field stress is applied.

The electric breakdown strength of the gas is calculated using T. H. Martins equation (4), below, from "An Empirical Formula for Gas Switch Breakdown Delay", 7th IEEE International Pulsed Power Conference.

$$pt = 97800 \, (E/p)^{-3.44} \tag{4}$$

Where: p=density, g/cc
    t=breakdown delay, Sec
    E=Electric Field, kV/cm

From equation (4) with a density of 0.25 g/cc (Nitrogen @200 Atmospheres) and a charging time of 200 ns, the average electric field is determined as 938 kV/cm. The charging time of 200 ns is determined by the resonant transformer frequency used to charge the tapered source line 41. The spacing between the inner and outer conductors of the tapered line is 5.65 cm which establishes a breakdown voltage limit of 5.3 MV. Likewise, the time of voltage application to the PFL 43 is 2.8 ns and by equation (4) the breakdown field is 3.18 MV/cm. The spacing between inner and outer conductors in the PFL section 43 is 1.45 cm which determines a maximum breakdown voltage of 4.61 MV. Since this is the lower of the two values it will determine the maximum operating power level. If the breakdown voltage of the tapered and PFL lines 41 and 43 is equal, the operational power level will be optimized.

But it is not always possible to achieve this condition, and still meet other specified parameters such as output impedance. The peak power corresponding to the 4.61 MV limiting breakdown voltage is 461 GW, but operation at the maximum limiting voltage is not expedient. To achieve the objective of 250 GW of power, the required operating voltage is 3.06 MV, which is ⅔ of the theoretical maximum voltage. Therefore, reliable operation at the objective level is expected.

The operation of the invention in FIG. 4 begins with the charging of the tapered transmission line 41 by a resonant transform or equivalent (not shown) through the high voltage charging connection 47-1. The first stage switch or intermediate switch 42 is adjusted to selfbreak when the voltage of the tapered line 41 reaches the objective voltage (1.53 MV). When the first stage switch 42 selfbreaks, the energy stored in the tapered line 41 transfers to the PFL output transmission line 43 with an efficiency approaching 100 percent as shown in FIG. 3. This high efficiency is a result of transmission line impedances determined in accordance with the invention. The output switch gap 44 is adjusted to selfbreak under overvoltage stress imposed by the 2.8 ns transfer of energy from the tapered line 41. The energy stored in the PFL output line 43 is formed into a 350 ns pulse at an impedance level of 9.375 Ohms. The pulse enters the impedance transformer 45-1 which increases the impedance level to 30 Ohms and passes the high pressure gas seal 48 to the output connection. 46-2 delivers the pulse to the load (not shown).

The invention encompasses all high-pressure gas switching in the nanosecond and sub-nanosecond pulse range. Examples include very high power levels, up to several terrawatts; and very narrow pulses, ranging from nanoseconds to several picosenconds, for example, in impulse (ultra-wideband) radar.

While the invention has been described in its presently preferred embodiments, it will be understood that words of description have been used, rather than words of limitation, and that changes within the purview of the appended claims may be made without departing from the scope and spirit of the invention.

We claim:

1. A pulse forming system which receives an electrical charging signal from an external high voltage source, and which outputs an electrical pulse, said pulse forming system comprising:

a tapered source transmission line which conducts said electrical charging signal from said external high voltage source, said tapered source transmission line having a continuous taper that generates internal voltage reflections for efficient coupling of energy from said electrical high voltage source, wherein a fractional rate of change of impedance along said tapered source transmission line is constant and given by dZ (l)/d(l)= k*dl, where z(l)=impedance of the line at position l,
   dz(l)=differential impedance at position l,
   d=differential length l,
   *=the operation of multiplication, and k=a constant value;

a first and a second electrical switch, a pulse forming transmission line element which has a predetermined impedance and has an output side and which is electrically charged by said tapered source transmission line when said first electrical switch is closed and said second electrical switch is open, said first electrical switch being connected between the input side of the pulse forming transmission line element and the tapered source transmission line, said second switch being connected to the output side of the pulse forming transmission line element; and an output transmission line which has an electrical impedance that matches the predetermined impedance of the pulse forming transmission line said output transmission line being electrically connected with said pulse forming transmission line to receive said electrical pulse.

2. A pulse forming system, as defined in claim 1 wherein said output transmission line is tapered with a continuous taper to promote internal voltage reflections for efficient coupling of energy.

3. A pulse forming system, as defined in claim 1, wherein said first electrical switch comprises a first high pressure gas switch, which connects the pulse forming transmission line, and which switches in times that can typically range between about 10.0 nanoseconds and 100 picoseconds and closes to allow the electrical charge to flow to and charge the pulse forming transmission line in times that can range down to about the order of nanoseconds.

4. A pulse forming system, as defined in claim 3, wherein said second electrical switch comprises a second high pressure gas switch which electrically connects the pulse forming transmission line to the output transmission line and which closes automatically when the pulse forming transmission line is charged with said electrical charge, said second high pressure gas switch thereby causing the pulse forming transmission line to output said electrical pulse.

5. A pulse forming system as defined in claim 4, where said first high pressure gas switch comprises a spark gap switch which is filled to about 300 atmospheres with pressurized gas.

6. A pulse forming system as defined in claim 5, wherein said first high pressure gas switch comprises a spark gap switch which is filled to about 300 atmospheres with pressurized gas.

7. A pulse forming system as defined in claim 1 wherein said tapered source transmission line has a series of uniform line sections with the impedance of each line selected to approximate the taper of a continuous line.

8. A pulse forming system as defined in claim 7 wherein said tapered source line is proportioned to improve the energy transfer from the tapered source line to said pulse forming line to a value approaching 100%.

9. A method of providing a pulse generation system, comprising the steps of:

(a) charging a non-uniform source line STL, initially with an intermediate switch to a pulse forming line PFL open, so that the PFL is uncharged; said source transmission line STL having a transit time TT and an impedance that varies as a function of length (l) ranging from Z0 to Z(l)=Z0 exp (k*l); and;

(b) connecting said source transmission line STL through said intermediate switch to said pulse forming transmission line PFL having an impedance AL and transit time TL; and whereby when the impedance of said source line STL is larger than ZL, and the transit time TT is larger than the delay time TL of the pulse forming line PFL, closure of said intermediate switch causes energy to flow from said source line to said pulse forming line and as energy and voltage build up on the PF1 an output switch closes and delivers the energy of the PF1 to an output transmission line.

10. The method of claim 9 further including a step of matching the impedance of the output transmission line to the pulse forming line PFL impedance, so that all of the energy in the PFL flows into the output line in the form of a pulse with time duration equal to 2*TL.

11. The method of claim 10 further including a step of configuring the output line as a tapered transmission line with an input impedance equal to the PFL impedance ZL and an output impedance equal to the load impedance: and the tapered impedance of the line matches the PF1 impedance ZL to the load impedance for maximum efficiency transfer of energy from the PFL to the load.

12. The method of claim 11 further including a step of configuring the output line as a tapered transmission line with an input impedance equal to the PFL impedance ZL and an output impedance equal to the line matches the PF1 impedance ZL to the load impedance for maximum efficiency transfer of energy from the PFL to the load.

* * * * *